United States Patent
Arai et al.

(10) Patent No.: US 7,569,895 B2
(45) Date of Patent: Aug. 4, 2009

(54) SEMICONDUCTOR DEVICE

(75) Inventors: Mitsuri Arai, Kodaira (JP); Shinichiro Wada, Fuchu (JP); Hideaki Nonami, Ome (JP)

(73) Assignees: Hitachi ULSI Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 338 days.

(21) Appl. No.: 11/334,498

(22) Filed: Jan. 19, 2006

(65) Prior Publication Data

US 2006/0175635 A1   Aug. 10, 2006

(30) Foreign Application Priority Data

Feb. 4, 2005   (JP) ............................. 2005-028374

(51) Int. Cl.
  *H01L 29/94* (2006.01)
(52) U.S. Cl. ..................................... 257/374
(58) Field of Classification Search ................. 257/273, 257/378, 374, 518, 520, 198, E21.166; 438/207, 438/318
See application file for complete search history.

(56) References Cited

U.S. PATENT DOCUMENTS 5,374,844 A * 12/1994 Moyer ......................... 257/582
2004/0183159 A1 * 9/2004 Tamaki et al. ............... 257/577

FOREIGN PATENT DOCUMENTS

JP   2002-057219   *   8/2000
JP   2002-299466       10/2002

* cited by examiner

*Primary Examiner*—Calvin Lee
(74) *Attorney, Agent, or Firm*—Antonelli, Terry, Stout & Kraus, LLP.

(57) ABSTRACT

A semiconductor device having a bipolar transistor improved with heat dissipation. A semiconductor device having bipolar transistors formed in a plurality of device forming regions electrically isolated from each other by device isolation trenches traversing the semiconductor layer, in which a device isolation trench for each of unit bipolar transistors connected in parallel is removed and the plurality of unit bipolar transistors connected in series are entirely surrounded with one device isolation trench.

3 Claims, 17 Drawing Sheets

SEMICONDUCTOR DEVICE

CLAIM OF PRIORITY

The present application claims priority from Japanese application JP 2005-028374 filed on Feb. 4, 2005, the content of which is hereby incorporated by reference into this application.

FIELD OF THE INVENTION

The present invention concerns an improvement for the heat dissipation of a bipolar transistor and, more in particular, it relates to an improvement for the heat dissipation of a semiconductor device which is an effective when applied to an insulated device isolation type bipolar transistor.

BACKGROUND OF THE INVENTION

JP-A No. 2002-299466 is a document that discloses an insulated device isolation type bipolar transistor technique on an SOI (Silicon On Insulator) substrate. Particularly, FIG. 2 shows an example of planar and cross sectional structures of a unit bipolar transistor. Further, FIG. 4 shows an example of the arrangement for interconnections when multiple unit bipolar transistors are connected in parallel. Further, FIG. 21 shows an example of a cross sectional structure of a multi-emitter type unit bipolar transistor.

SUMMARY OF THE INVENTION

The present inventors have found that the prior art described above involves the following problems.

The structure of a unit bipolar transistor in the prior art is designed, for improving the performance and increasing the integration degree of devices, to a minimum layout dimension or a dimension approximate to the minimum layout dimension and it has been found that when the unit bipolar transistor is operated at a high voltage or a high current, characteristics thereof are sometimes degraded by the effect of self-heat generation.

Further, in a case of using a plurality of unit bipolar transistors connected in parallel, it has been found that the amount of heat generation is higher for unit bipolar transistors arranged in a central portion than that for the unit bipolar transistors arranged at the periphery, and scattering of temperature at the junction for each of the unit bipolar transistors gives an effect on the scattering of device characteristic of the transistors.

Further, in a case of using a plurality of unit bipolar transistors connected in parallel, when emitter interconnections are extended in the direction of each row, it has been found that the unit bipolar transistors arranged at the portion with low emitter interconnection resistance cause thermal runaway under the effect of the self heat generation effect leading to destruction due to the difference of emitter interconnection resistance between the unit bipolar transistors arranged at a portion with low emitter interconnection resistance and unit bipolar transistors arranged at a portion with high emitter interconnection resistance, when the unit bipolar transistors are operated at a high voltage or a high current.

The present invention intends to provide a technique capable of improving the heat dissipation of an insulated device isolation type bipolar transistor.

The invention further intends to provide a technique capable of reducing capacitance relative to a substrate in a case of using a plurality of unit bipolar transistors connected in parallel.

The outline for typical inventions among those disclosed in the present application is simply described as below.

That is, the present invention has a structure in a semiconductor device in which bipolar transistors are formed in a plurality of device forming regions electrically isolated from each other by device isolation trenches traversing a semiconductor layer, wherein a device isolation trench for each of unit bipolar transistor constituting the plurality of bipolar transistors connected in parallel is removed, and the plurality of bipolar transmitters are entirely surrounded with a device isolation trench.

Further, in the invention, a distance between the emitter of the unit bipolar transistor and the device isolation trench is enlarged.

(1) In a fist aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and buried collector regions for the bipolar transistors are disposed being spaced apart from each other.

(2) In a second aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and buried collector regions for each of adjacent bipolar transistors are arranged in contact with each other.

(3) In a third aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and the buried collector region for the bipolar transistor disposed at the outermost periphery and the device isolation trench are disposed being spaced apart from each other.

(4) In a fourth aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and the buried collector region for the bipolar transistors disposed at the outer most periphery and the device isolation trench are disposed being spaced apart from each other.

(5) In the semiconductor device as described in (1) or (4) above, it is preferred that a depletion region with the low concentration layer is between the buried collector region of the bipolar transistor and the device isolation trench.

(6) In the semiconductor device as described in (1) above, it is preferred that the device isolation trench is disposed being spaced apart from the emitter region of the bipolar transistor and the end of the buried collector region of the bipolar transistor is disposed being enlarged and spaced from the emitter region of the bipolar transistor.

(7) In the semiconductor device as described in (1) above, it is preferred that the device isolation trench is disposed being remote from the emitter region of the bipolar transistor and being enlarged, and the buried collector region of the bipolar transistor is spaced apart from the device isolation trench.

(8) In the semiconductor device as described in (3), (4), or (7) above, it is preferred that a depletion region with a low concentration layer is formed between the buried collector region of the bipolar transistor and the device isolation trench.

(9) In the semiconductor device as described in (1) above, it is preferred that bipolar transistors are arranged thinly in the central portion and densely in the peripheral portion.

(10) In the semiconductor device as described in (1) above, it is preferred that the emitter interconnection is extended in the direction of each row (or column), and the number of the bipolar transistors in the direction of each row (column) is made less than the number of the bipolar transistors in the direction of the column (or row).

Typical effects of the invention obtained by the means described above are that the heat dissipation of the bipolar transistors formed in the device forming regions isolated from each other by the device isolation trenches can be improved.

BRIEF DESCRIPTION OF THE DRAWINGS

FIG. 5 shows a result of confirming the effect of the embodiment shown in FIG. 4 by electrical characteristics in which

FIG. 9 shows an embodiment of the invention in which a plurality of unit transistors are connected in parallel; in which

FIG. 12 shows a result of confirming the effect of the embodiment shown in FIG. 10 by electrical characteristics, in which

FIG. 1, and FIGS. 13B to 13D are plan views for the unit transistor as an embodiment of the invention;

DETAILED DESCRIPTION OF THE PREFERRED EMBODIMENTS

The present invention is to be described specifically by way of examples with reference to the drawings. In this embodiment, the bipolar transistor is simply referred to as a transistor.

Embodiment 1

Figure 1A:
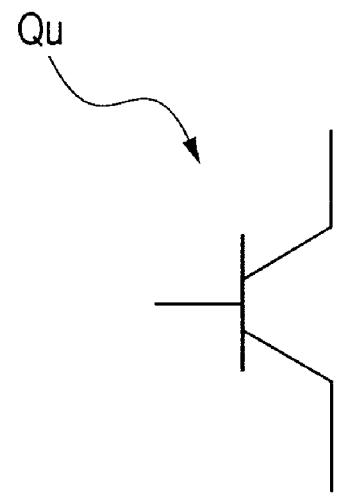
FIG. 1A is a symbol chart for a transistor constituting a semiconductor device as an embodiment according to the present invention.

FIG. 1A shows a unit transistor Qu constituting a semiconductor device applied with the present invention.

Figure 1B:
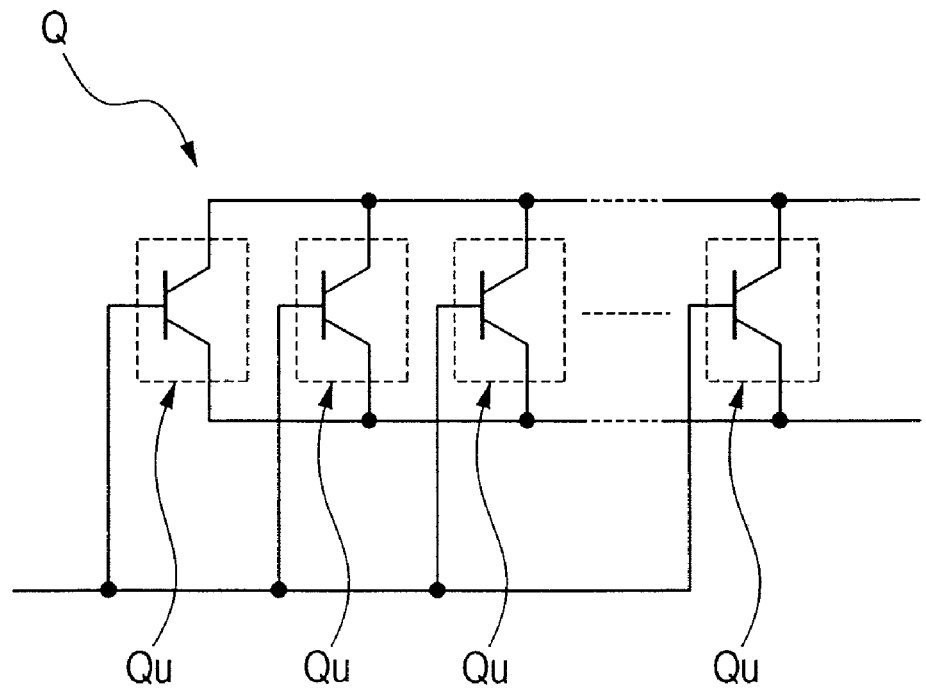
FIG. 1B is a circuit diagram in a case of connecting the transistors in FIG. 1A in parallel.

In FIG. 1B, a transistor Q is formed by connecting a plurality of the unit transistors shown in FIG. 1A in parallel.

Figure 2A:
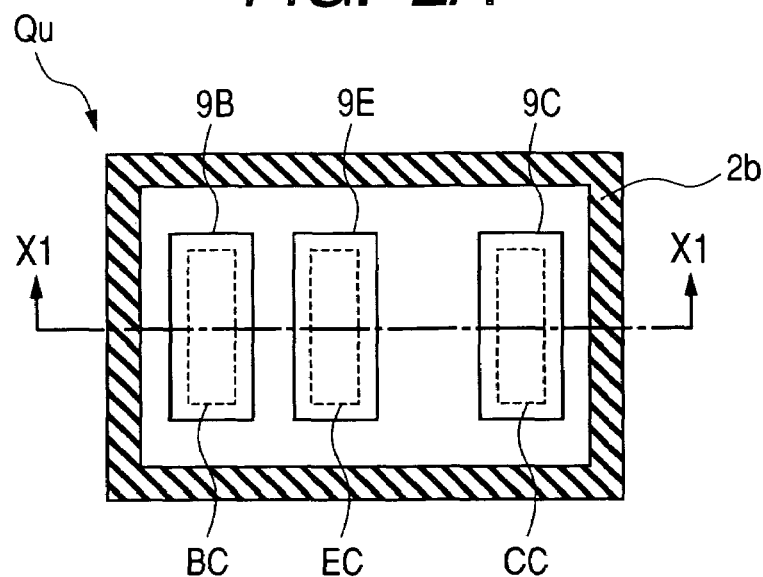
FIG. 2A is a plan view of a unit transistor of the existent structure shown in FIG. 1.
Figure 2B:
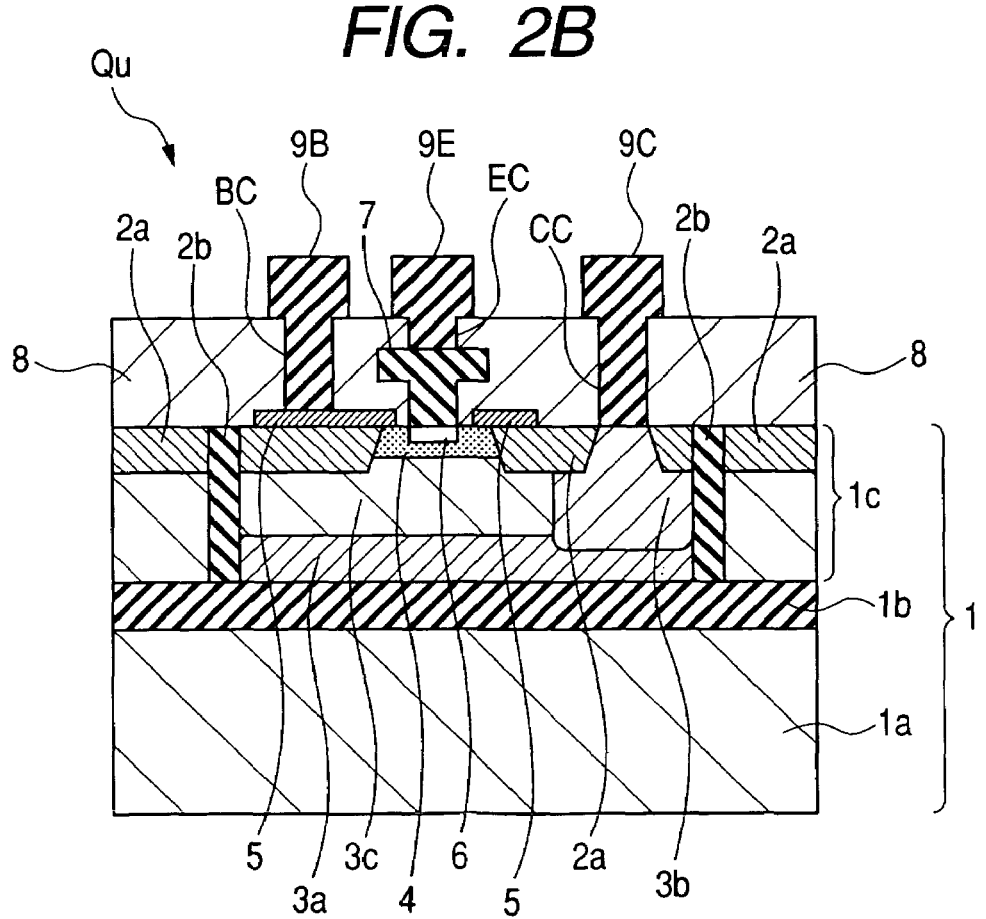
FIG. 2B is a cross sectional view taken along line X1-X1 in FIG. 1A in a case where the unit transistor is an npn type.

FIG. 2 shows an example of a device structure for a unit transistor Qu in the prior art shown in FIG. 1. FIG. 2A shows a plan view of the unit transistor Qu, and FIG. 2B shows a cross sectional view taken along line X1-X1 in FIG. 2A in a case where the unit transistor Qu is an npn type. While the example of the device structure is an insulated device isolation type transistor using an SOI substrate, the invention is applicable also to an insulated device isolation type transistor using a BULK substrate. Further, the conduction type of the transistor may be either an npn type or a pnp type. Further, the structure of the transistor may be a lateral, longitudinal, or hetero structure with no particular restriction.

In FIGS. 2A and 2B, and subsequent figures, it is noted that numeral 1 identifies an SOI substrate comprised of a lower substrate layer 1a, and insulative layer 1b and a semiconductor device forming area 1c. In addition, areas forming the collector, base and emitter of the devices, the device forming area includes insulative layers 2a and 2b. In particular, the area 2b is a device isolation trench. As illustrated in FIGS. 2A and 2B, and subsequent figures, for example, the emitter, base and collector regions are formed with an emitter region 6, a base region 4 and collector regions 3a, 3b and 3c. A base contact BC is formed with a base electrode 9B contacting a contact layer 5 which connects the electrode 9b with the base region 4. A collector contact region CC is formed with the electrode 9C coming into contact with the collector region 3b. The emitter contact EC is formed with the emitter electrode 9E and the underlying emitter contact area 7.

Figure 3A:
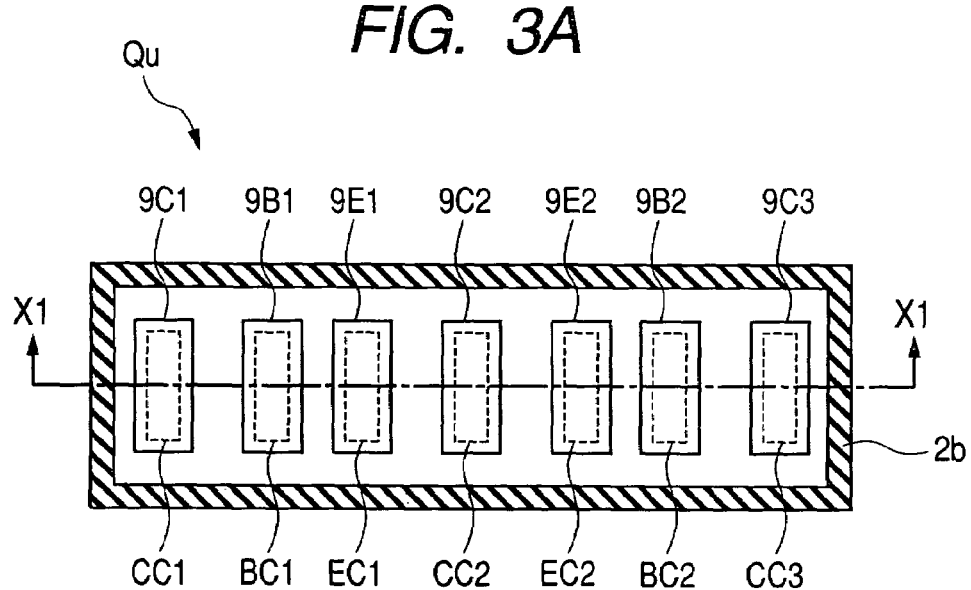
FIG. 3A is a plan view of a unit transistor of a multi-emitter type of the existent structure shown in FIG. 1.
Figure 3B:
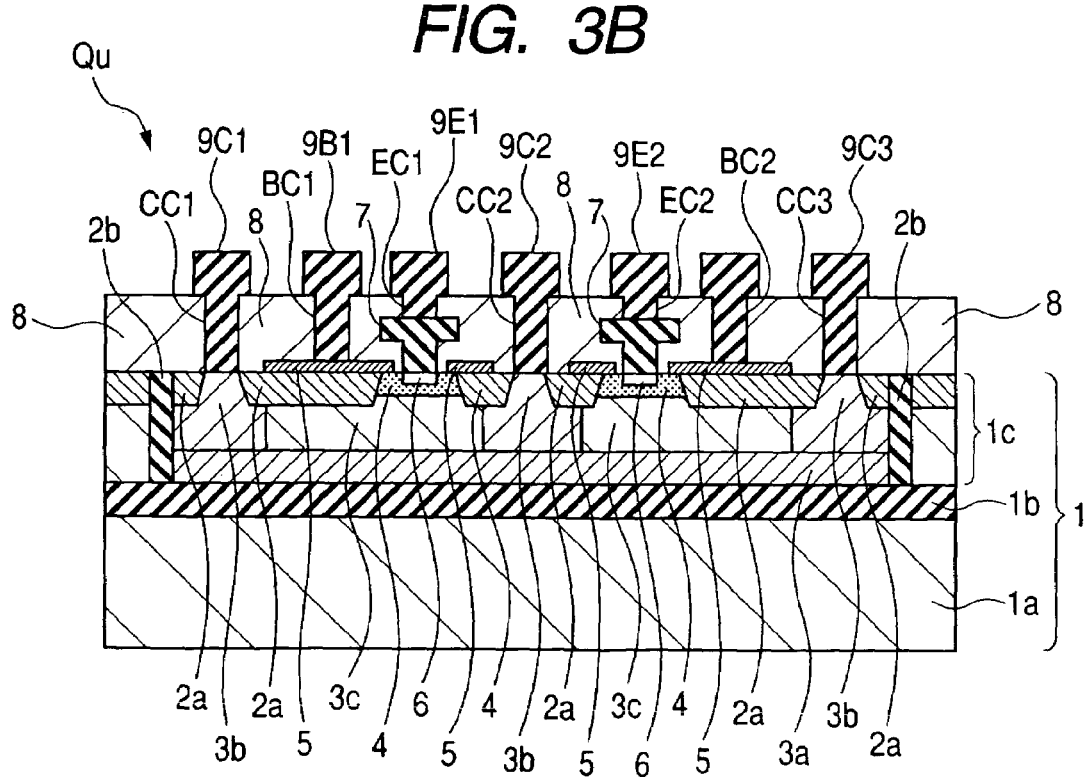
FIG. 3B is a cross sectional view taken along line X1-X1 in FIG. 1A in a case where the unit transistor is an npn type.

FIG. 3 shows an example of a device structure in which the unit transistor Qu in the prior art shown in FIG. 1 is a multi emitter type. FIG. 3A is a plan view for the unit transistor Qu, FIG. 3B shows a cross sectional view taken along line X1-X1 in FIG. 3A in a case where the unit transistor Q is an npn type. The size between two emitters EC1-EC2 and the size between emitter-device isolation trenches 2b is designed as a minimum layout size in the process, or a size approximate to the minimum layout size in order to enhance the performance and increasing the integration degree of the device.

Since the unit transistor Qu is surrounded with a device isolation trench 2b of high heat resistance for electrical isolation from adjacent devices, structure has poor heat dissipation and high thermal resistance.

Figure 4A:
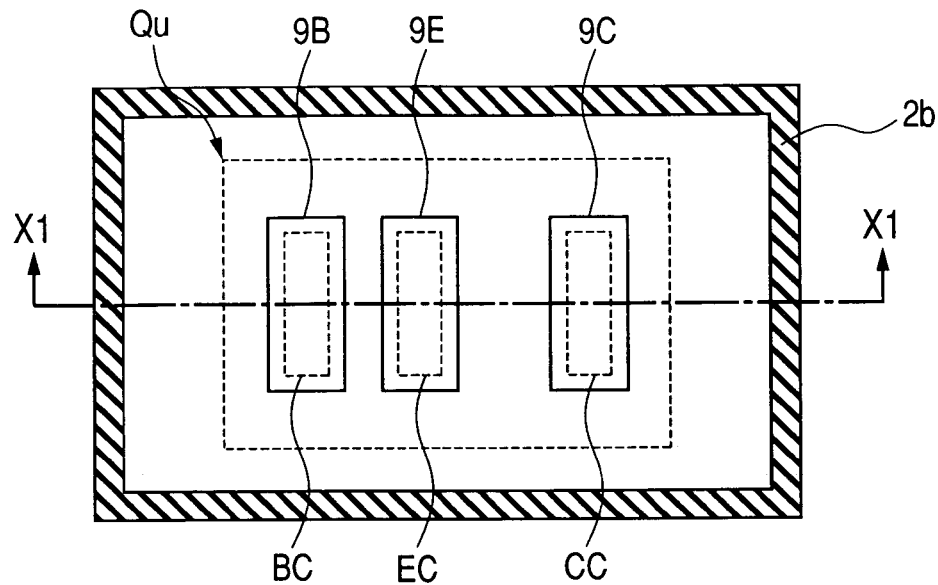
FIG. 4A is a plan view of a unit transistor as an embodiment of the invention.
Figure 4B:
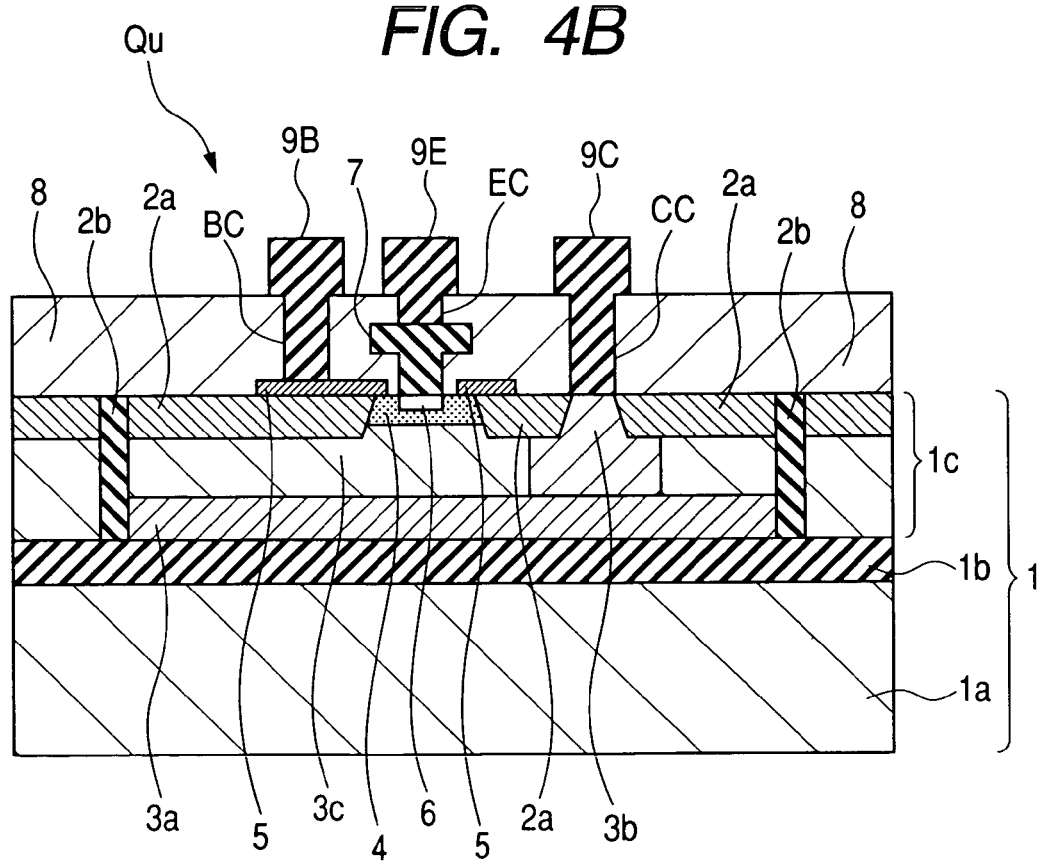
FIG. 4B is a cross sectional view along line X1-X1 in FIG. 4A in a case where the unit transistor is an npn type.

FIG. 4 shows an example for the unit transistor. The unit transistor may also be in a multi-emitter structure as shown in FIG. 3. FIG. 4A and FIG. 4B show an example in a case of disposing the device isolation trench 2b of the unit transistor Qu and the end of the buried collector region 3a shown in FIG. 2 being extended and spaced from the emitter EC. Since the heat generation in the transistor Qu is shielded by the device isolation trench 2b of high thermal resistance, the thermal resistance Rth of the unit transistor Qu depends on the inside area of the device isolation trench 2b. Accordingly, by extending the device isolation trench 2b, it is possible to obtain a structure capable of decreasing the thermal resistance of the unit transistor Qu by extending the device isolation trench 2b.

FIG. 5 shows a result of measurement for the unit transistor in a case of applying the example in FIG. 4. What is shown by 'device isolation trench standard' in the graph is the transistor characteristics of the existent structure shown in FIG. 2 and other data are data for the unit transistor in a case of applying the example in FIG. 4.

Figure 5A:
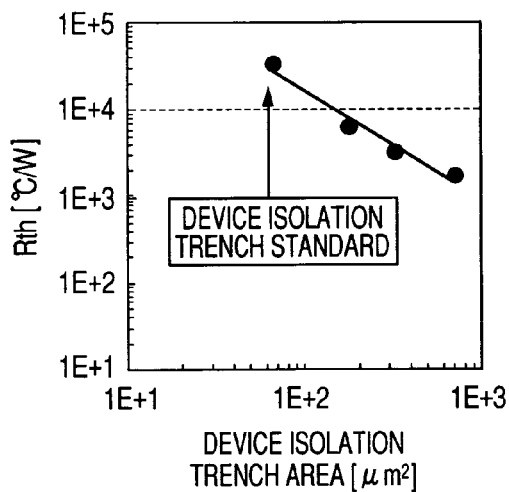
FIG. 5A shows the dependence of the thermal resistance Rth of the unit transistor on the device isolation trench area.

FIG. 5A shows the dependence of the thermal resistance Rth of the unit transistor on the device isolation trench area (area insides the device isolation trench 2b). Rth lowers alone with enlargement of the device isolation trench 2b and the heat dissipation is improved.

Figure 5B:
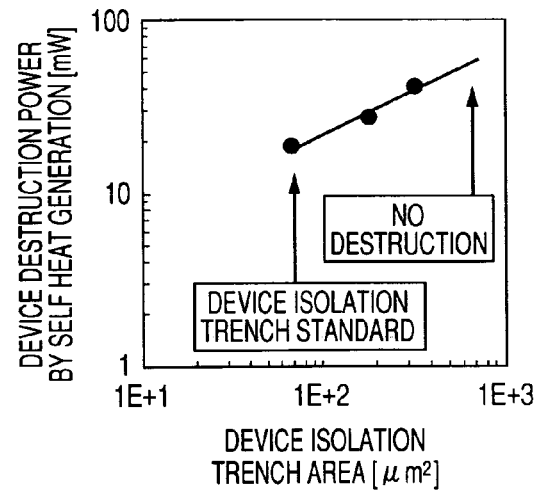
FIG. 5B shows the dependence of a device destruction power by the self heat generation of the unit transistor on the device isolation trench area.

FIG. 5B shows the dependence of the device destruction power by the self heat generation of the unit transistor on the device isolation trench area. It is possible to increase the power that causes destruction of the device by the lowering of the thermal resistance of the unit transistor by the enlargement of the device isolation trench 2b. In the example, device destruction was not observed when the trench was enlarged by 8 μm each in the direction of the row and direction of the column relative to the device isolation trench 2b of the unit transistor of the existent structure shown in FIG. 2.

Figure 5C:
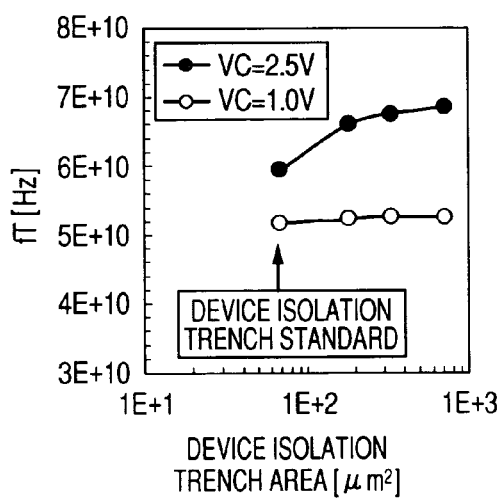
FIG. 5C shows the dependence of a current gain cut-off frequency $f_T$ on the device isolation trench area.

FIG. 5C shows the dependence of the current gain cut-off frequency $f_T$ on the device isolation trench area. Along with the enlargement of the device isolation trench 2b, the current gain cut-off frequency $f_T$ at high VCE is also improved.

Figure 5D:
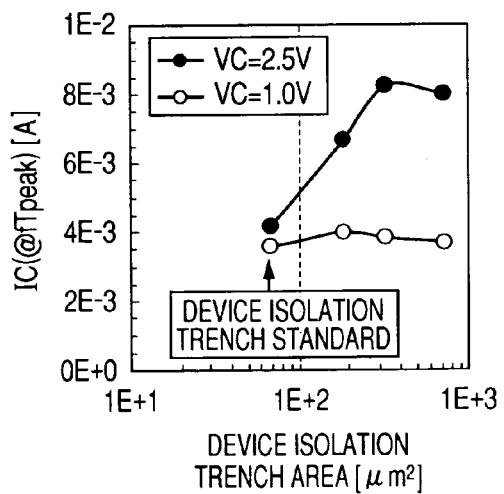
FIG. 5D shows the dependence of a collector current (IC@$f_{Tpeak}$) at the maximum current gain cut-off frequency $f_{Tpeak}$ on the device isolation trench area.

FIG. 5D shows the dependence of the collector current ($IC@f_{Tpeak}$) upon maximum current gain cut-off frequency ($f_{Tpeak}$) on the device isolation trench area. It was confirmed that $IC@f_{Tpeak}$ was also improved along with enlargement of the device isolation trench 2b.

Figure 6:
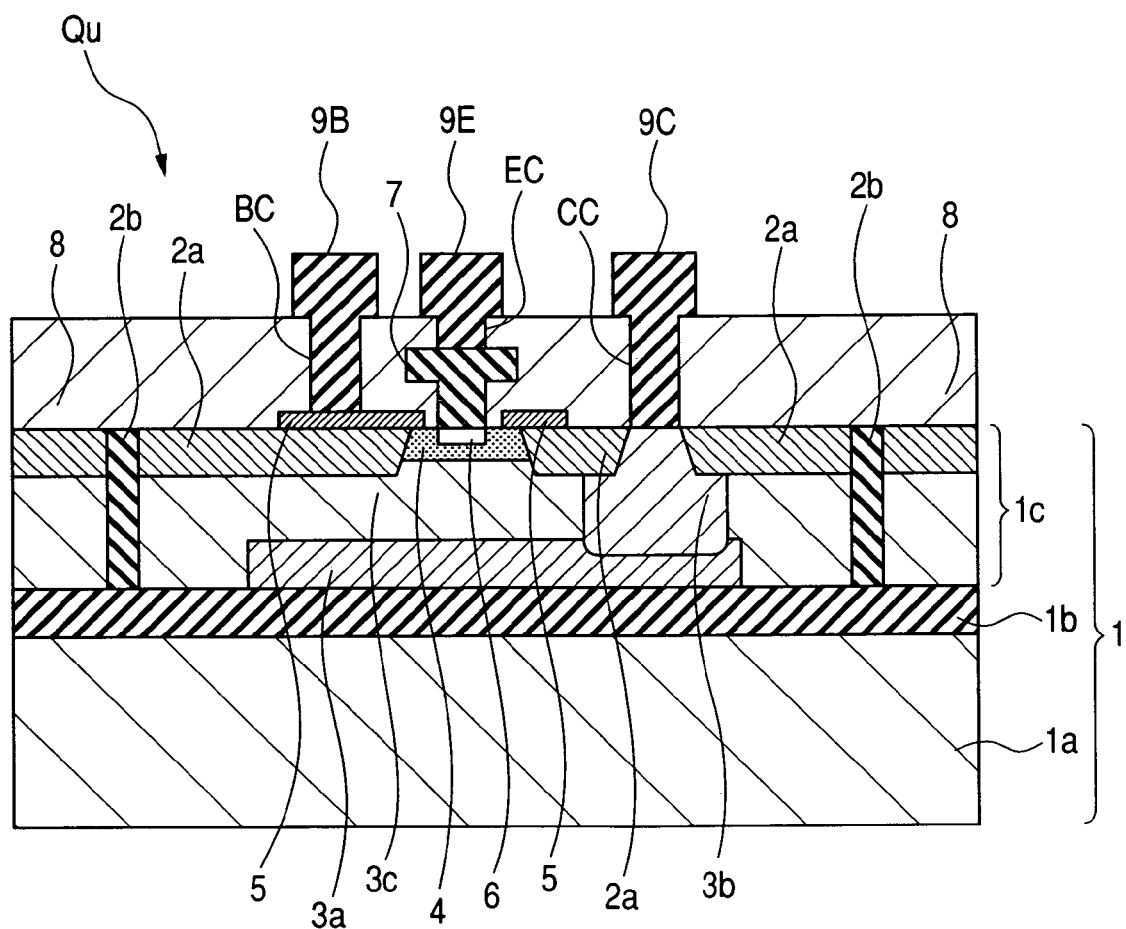
FIG. 6 is a cross sectional view taken along line X1-X1 of other embodiment shown in FIG. 4A.

FIG. 6 shows other example in the unit transistor shown in FIG. 4. This is a structure in which the buried collector region 3a is formed only in the identical region before enlargement of the device isolation trench 2b. Compared with FIG. 4A, since the area of the buried collector region 3a is smaller, the bottom component of the capacitance relative to the substrate can be decreased.

Figure 7:
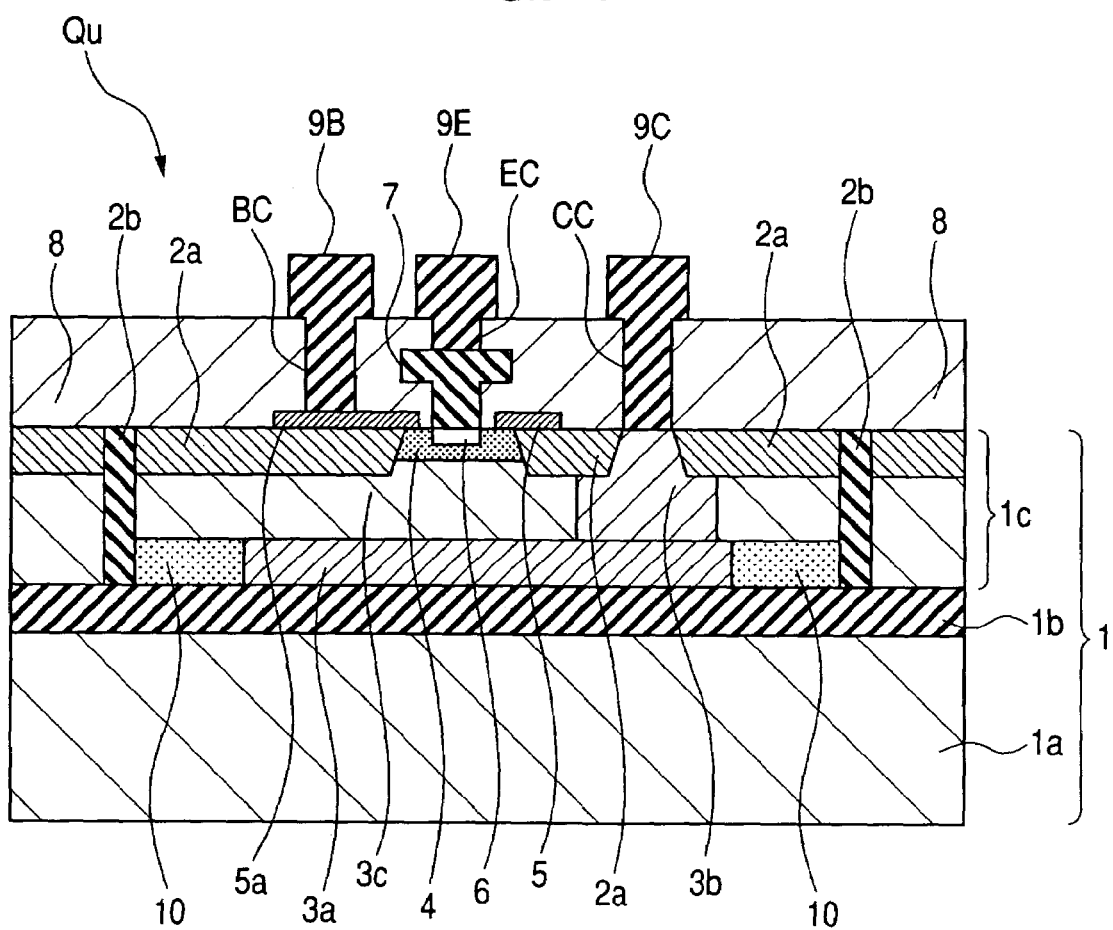
FIG. 7 is a cross sectional view taken along line X1-X1 of as a embodiment shown in FIG. 4A.

FIG. 7 shows other example in the unit transistor shown in FIG. 6. This is a structure in which a depletion region with a low concentration layer 10 is formed between the buried collector region 3 and the device isolation trench 3a. In the structure shown in FIG. 4B, the peripheral component of the capacitance relative to the substrate is determined only with the capacitance of the device isolation trench 2b, whereas this is determined by a serial capacitance of the capacitance of the device isolation trench 2b and the capacitance of the depletion region with the low concentration layer 10 in the structure of FIG. 7. Further, also for the bottom component of the capacitance relative to the substrate, it is determined by a serial capacitance of the capacitance for the depletion region with the low concentration layer 10 and the capacitance for the insulative layer 1b of the SOI substrate 1 at the end of the buried collector region 3a. Accordingly, this is a structure capable of further decreasing the capacitance relative to the substrate compared with the structure of FIG. 6.

Embodiment 2

Figure 8A:
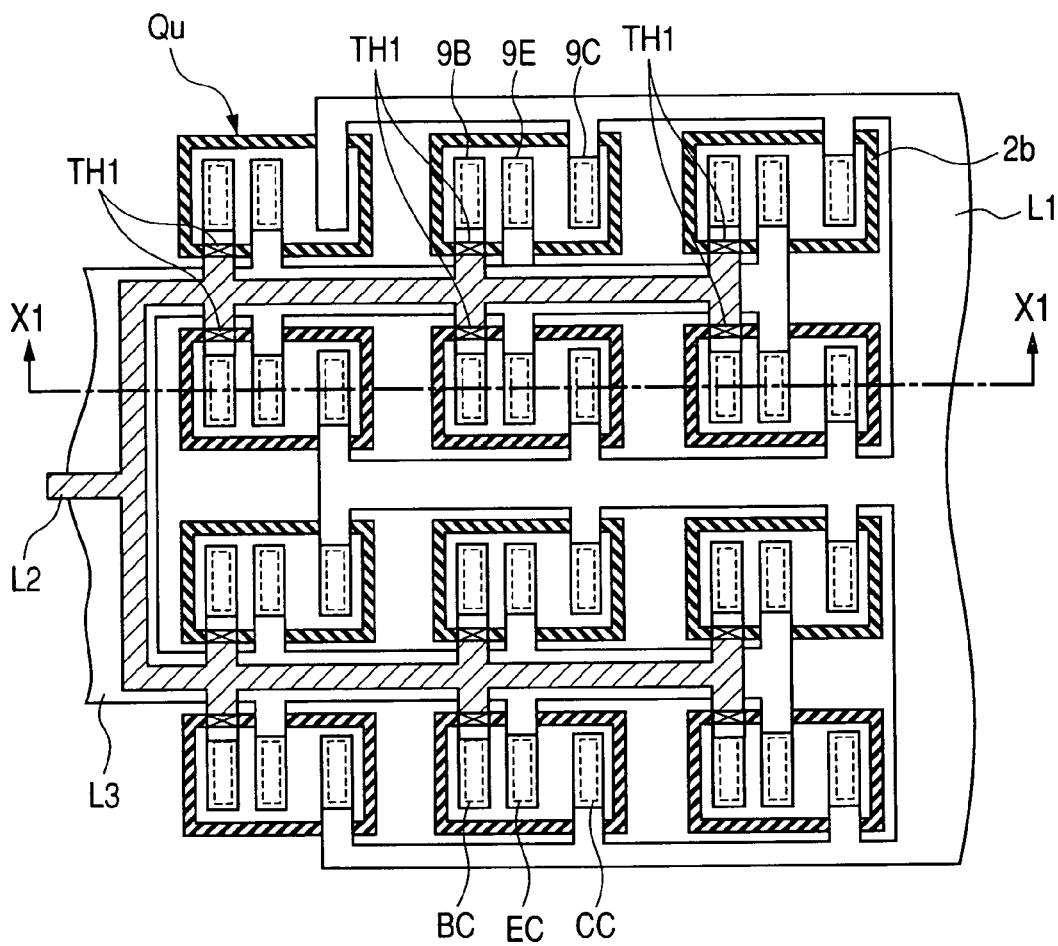
FIG. 8A is a plan view in a case of connecting in parallel a plurality of unit transistors of the existent structure shown in FIG. 1.
Figure 8B:
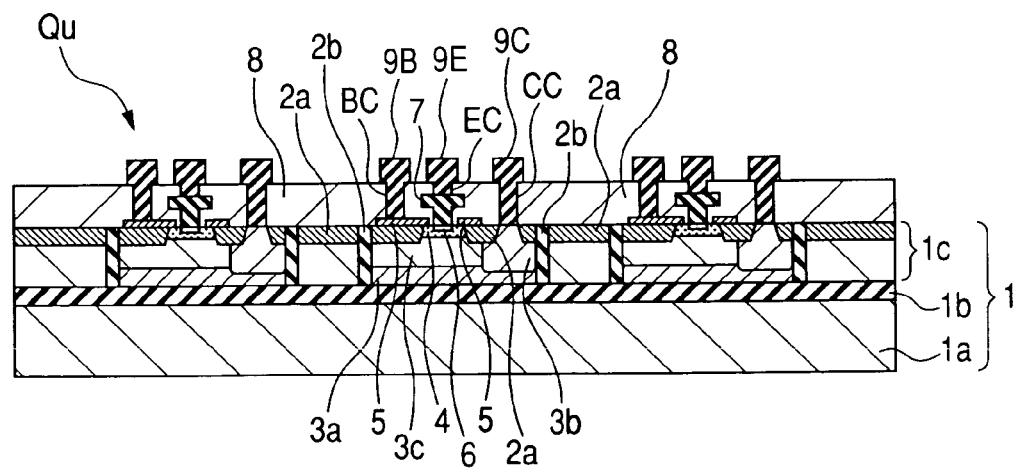
FIG. 8B is a cross sectional view taken along line X1-X1 in FIG. 8A in a case where the unit transistor is an npn type.

FIG. 8 shows an example of a device structure in a case of connecting in parallel a plurality of the unit transistors Qu in the prior art. FIG. 8A is a plan view in a case of connecting in parallel a plurality of the unit transistors Qu and FIG. 8B is a cross sectional view taken alone line X1-X1 in FIG. 8A in a case where the unit transistor Qu is an npn type.

Figure 9A:
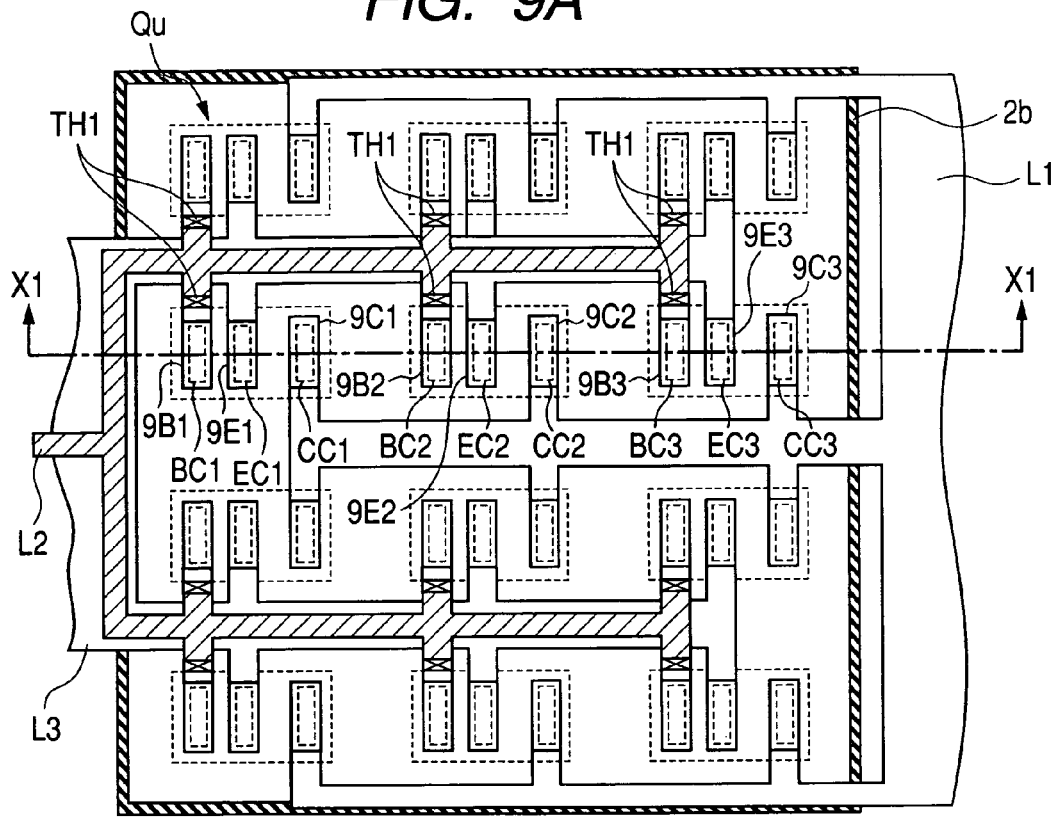
FIG. 9A is a plan view in which individual device isolation trenches for a plurality of unit transistors connected in parallel of the existent structure shown in FIG. 1 are removed and the unit transistors connected in parallel are entirely surrounded with one device isolation trench.
Figure 9B:
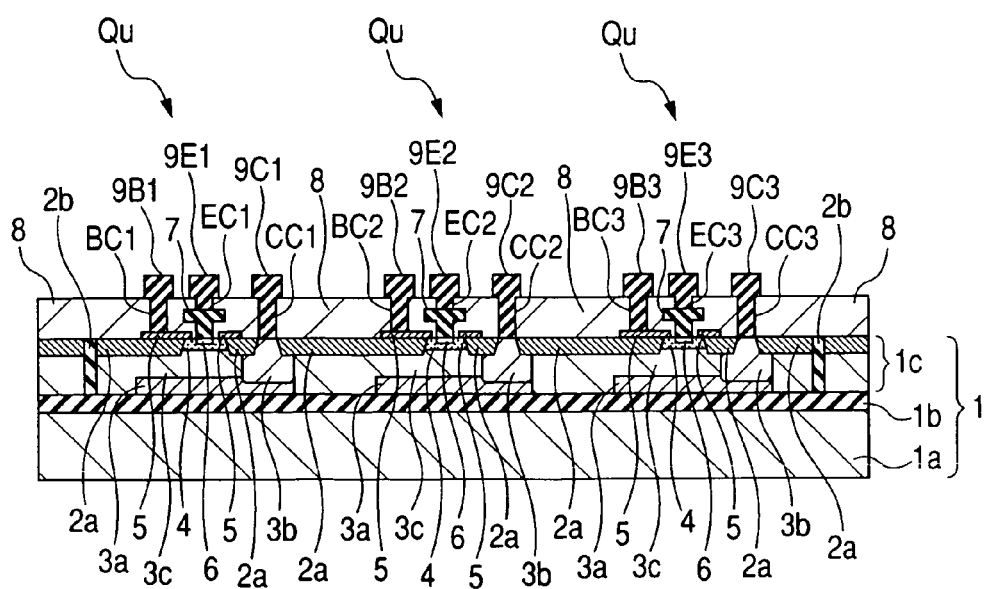
FIG. 9B is a cross sectional view taken along line X1-X1 in FIG. 9A in a case where the unit transistor is an npn type.

FIG. 9 shows an example in a case of connecting in parallel a plurality of the unit transistors Qu in parallel. The unit transistor may also be a multi-emitter structure as shown in FIG. 3. FIG. 9A and FIG. 9B show an example of removing the device isolation trench 2b for each of the unit transistors Qu and entirely surrounding the plurality of unit transistors Qu connected in parallel with one device isolation trench 2b.

While the cross sectional structure is similar with that of the multi-emitter type unit transistor Qu shown in FIG. 3, the unit transistor Qu in FIG. 3 for enhancing the performance and increasing the integration degree of the device, is designed to a minimum layout size or a size approximate to the minimum layout size in the process. On the other hand, the example of FIG. 9 has a structure in which the size between emitters (EC1, EC2, EC3) of each of the unit transistors Qu, and the size between the emitter of the unit transistor Qu disposed to the outer most periphery and the device isolation trench 2b is much wider in order to improve the heat dissipation.

In this embodiment, since the inter-emitter distance between adjacent unit transistors Qu is spaced apart further and the distance between the emitter of the unit transistor Qu deposed to the outermost periphery and the device isolation trench is enlarged, this provides a structure capable of lowering the thermal resistance Rth of the unit transistor Qu compared with the existent structure shown in FIG. 8. Further, since the plurality of unit transistors Qu are surrounded with one device isolation trench 2b, this provides a structure capable of decreasing the scattering of the thermal resistance Rth between each of the unit transistors Qu. Further, since the device isolation trench 2b disposed to each of the unit transistors Qu individually is removed, the peripheral component of the capacitance relative to the substrate which was determined by the device isolation trench 2b between adjacent unit transistors Qu is eliminated, so that the capacitance relative to the substrate can be decreased compared with that in FIG. 8.

Figure 10:
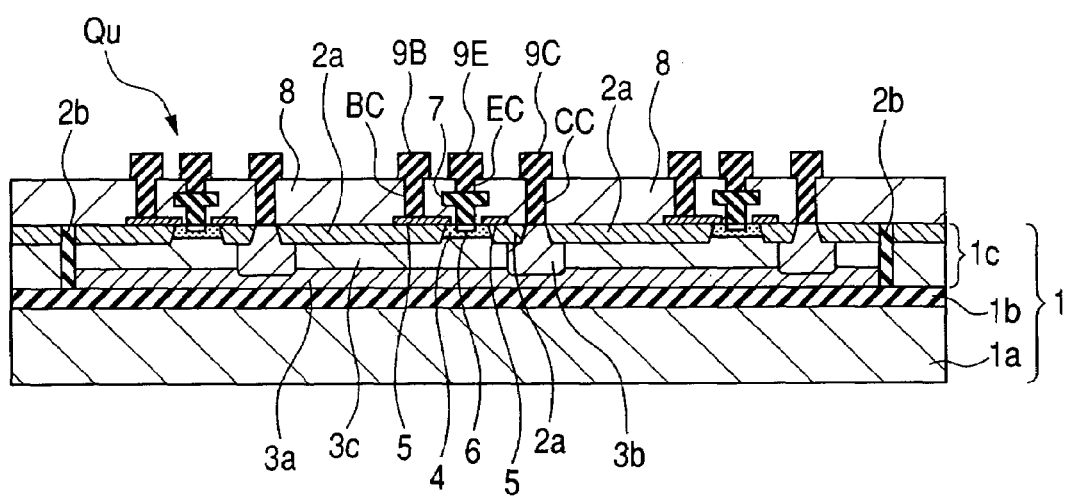
FIG. 10 is a cross sectional view taken along line X1-X1 of other embodiment of FIG. 9A.

FIG. 10 shows other embodiment in a case of connecting in parallel a plurality of unit transistors Qu shown in FIG. 9. This is a structure in which the buried collector region 3a is buried over the entire inside of the device isolation trench 2b. Since the buried collector regions 3a of the respective unit transistors Qu are in contact with each other, this provides a structure capable of decreasing the scattering of the thermal resistance Rth between each of the unit transistors Qu. Like the structure shown in FIG. 9, the peripheral component of the capacitance relative to the substrate can be decreased and, in this embodiment, the capacitance relative to the substrate for the entire transistors connected in parallel in plurality was decreased by about 25% compared with that of the existent structure shown in FIG. 8.

Figure 11:
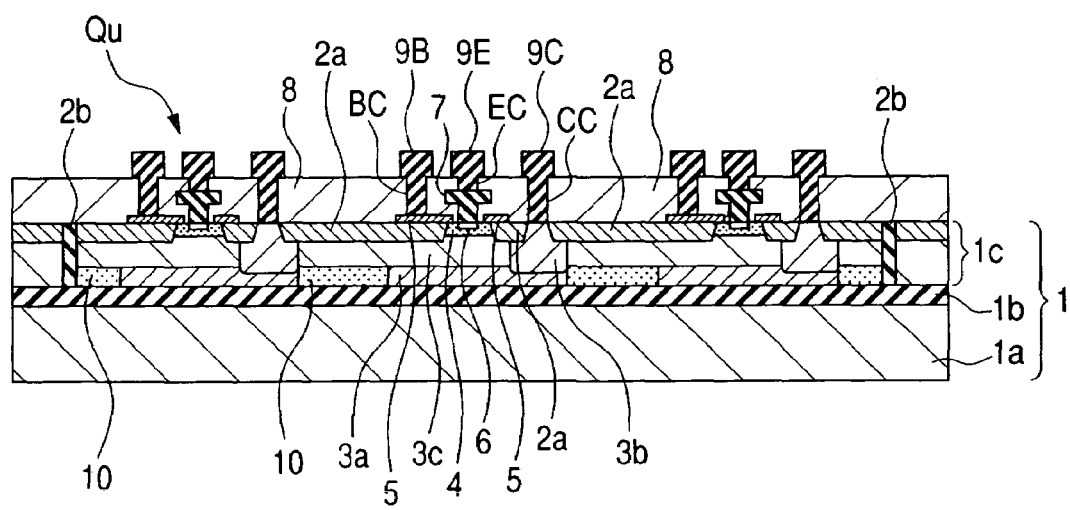
FIG. 11 is a cross sectional view taken along line X1-X1 of other embodiment of FIG. 9A.

FIG. 11 shows other embodiment in a case of connecting in parallel a plurality of unit transistors Qu shown in FIG. 9. This is a structure in which a depletion region with a low concentration layer 10 is formed between the buried collector regions 3a of each of the unit transistors Qu and between the buried collector region 3a of the unit transistor Qu arranged at the outer most circumference and the device isolation trench 2b.

Since the peripheral component of the capacitance of each unit transistor Qu relative to the substrate is determined by the serial capacitance of the capacitance for the depletion region with the low concentration layer 10 and the capacitance for the insulated layer 1b of the SOI substrate 1, this provides a structure capable of further decreasing the capacitance relative to the substrate compared with that in FIG. 9 and FIG. 10.

Figure 12A:
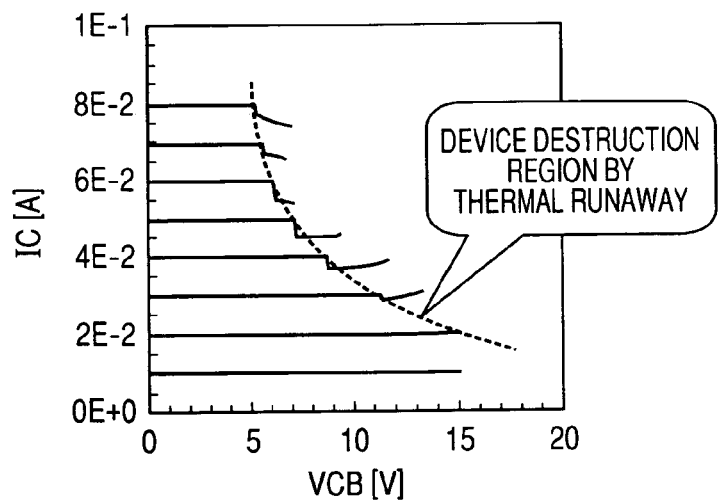
FIG. 12A shows IC-VCB characteristics in a case where the existent unit transistor Qu as shown in FIG. 8A has a device isolation trench 2b individually.
Figure 12B:
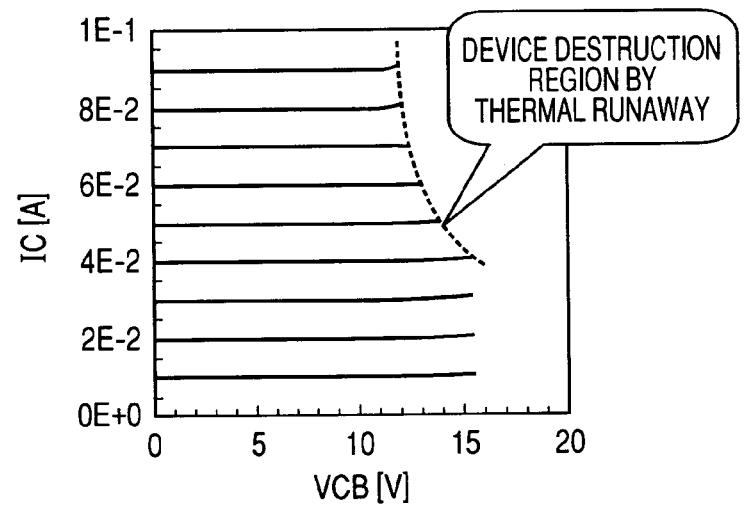
FIG. 12B shows IC-VCB characteristics in a case of inserting a ballast resistance to the emitter terminal for each of the unit transistors in a structure where the existent unit transistor Qu as shown in FIG. 8A has a device isolation trench 2b individually.
Figure 12C:
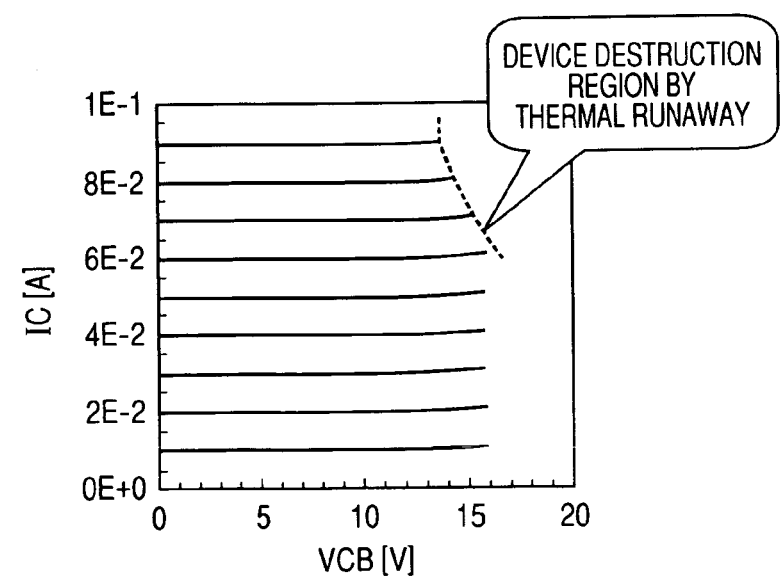
FIG. 12C shows IC-VCB characteristics in a case of inserting a ballast resistance to the emitter terminal of each unit transistor Qu and, further, applying the embodiment shown in FIG. 10.

FIGS. 12A to 12C show the result for measurement of IC-VCB characteristics in a case of connecting in parallel a plurality of base-ground unit transistors Qu used at 2 mA emitter. The transistors are arranged by the number of five in the direction of the column and by the number of eight in the direction of row, and the unit transistors Q are connected in parallel by the number of 40 in total. FIG. 12A shows the IC-VCB characteristics in a case where the existent unit transistor Qu as shown in FIG. 8A has the device isolation trench 2b individually. By the scattering of the parasitic resistance for the emitter interconnection of each of the unit transistors Qu, in the unit transistors Qu arranged to a portion of the emitter interconnection with a lower parasitic resistance, the characteristics are far from reaching the aimed performance: IC=40 mA (@VCB=14 V) due to the thermal runaway under the effect of the self heat generation effect. FIG. 12B shows an IC-VCB characteristic in a structure in which each of the existent unit transistors Qu as shown in FIG. 8B individually has a device isolation trench 2b in a case where a ballast resistor is inserted to the emitter terminal of each unit transistor Qu used generally for decreasing the scattering of the base-emitter voltage VBE of the each unit transistor Qu. While the device breakdown voltage caused by the thermal runaway is improved remarkably compared with the characteristic shown in FIG. 12A, the aimed performance can not be attained because of the thermal runaway caused by the self-heat generation effect of specified unit transistors Qu by the scattering of the thermal resistance Rth between each of the unit transistors Qu. FIG. 12C shows the IC-VCB characteristic in a case of inserting the ballast resistor to the emitter terminal for each of the unit transistors Qu and, further, applying the embodiment shown in FIG. 10. This is an embodiment of attaining the aimed performance by decreasing the scattering of the thermal resistance between each of the unit transistors due to the structure in which the transistors connected in parallel are entirely surrounded with one device isolation trench 2b.

Embodiment 3

FIGS. 13A to 13D are plan views showing other embodiment regarding the method of extending the device isolation trench 2b in the unit transistor Qu.

Figure 13A:
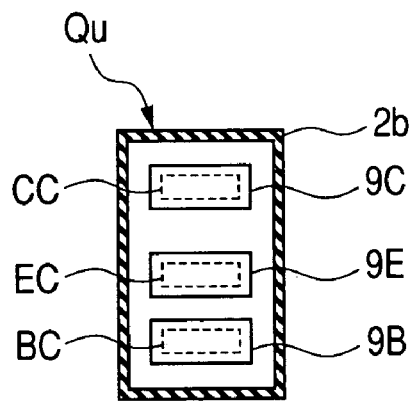
FIG. 13A is a plan view of the unit transistor in shown

FIG. 13A is a plan view of an existent structure.

Figure 13B:
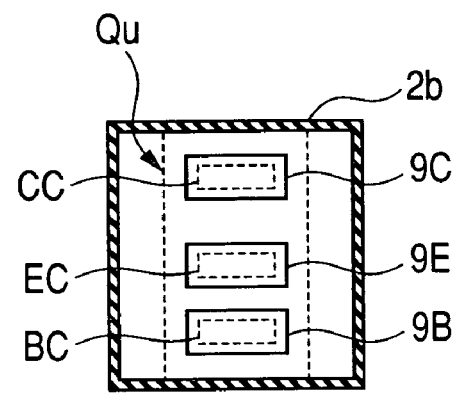
Figure 13C:
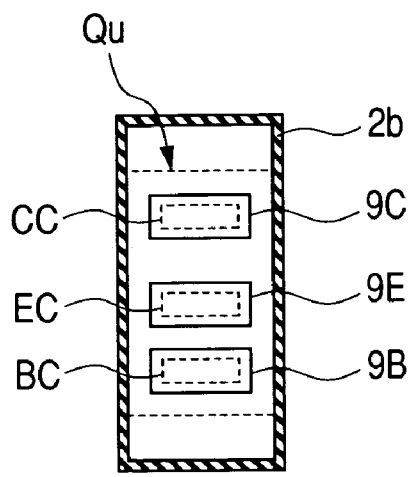
Figure 13D:
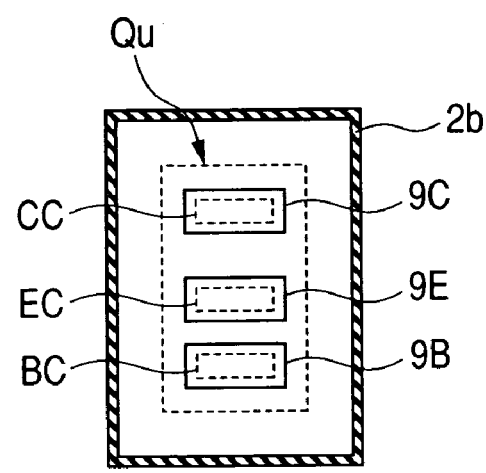

FIG. 13B, FIG. 13C, and FIG. 13D show embodiments of extending the device isolation trench 2b. The method of extending the device isolation trench 2b may be applied either only in the direction of row only in the direction of column or further, a combination thereof. Further, the size can be designed to the necessary minimum in view of FIG. 5.

Embodiment 4

Figure 14A:
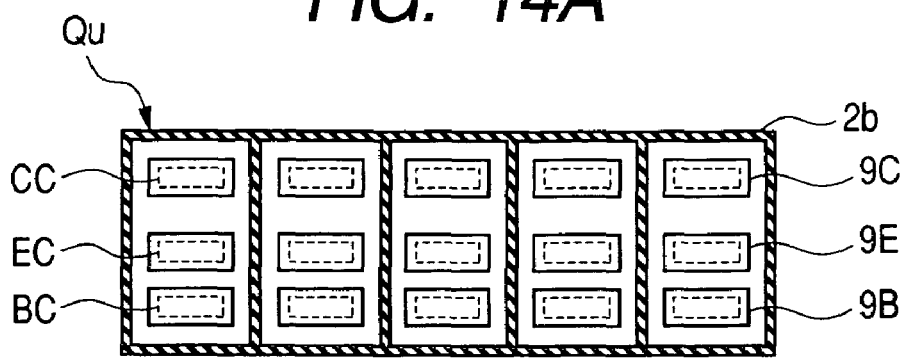
FIG. 14A is a plan view in a case of connecting in parallel a plurality of unit transistors shown in FIG. 1.
Figure 14B:
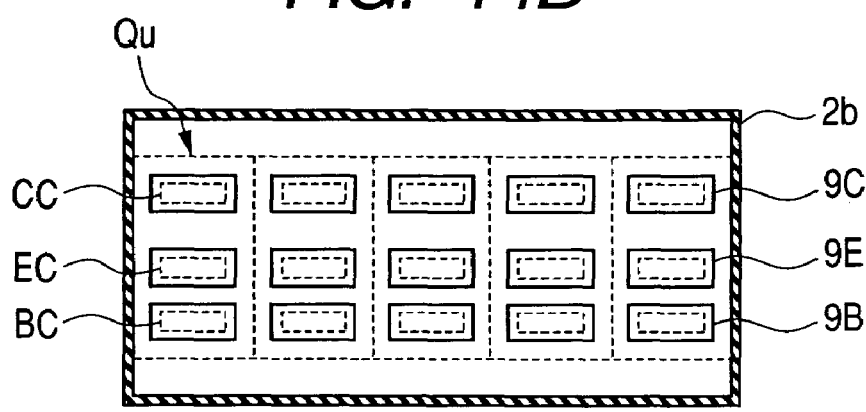
FIG. 14B and FIG. 14C are plan views in which a plurality of unit transistors as one embodiment of the invention are entirely surrounded with a device isolation trench.
Figure 14C:
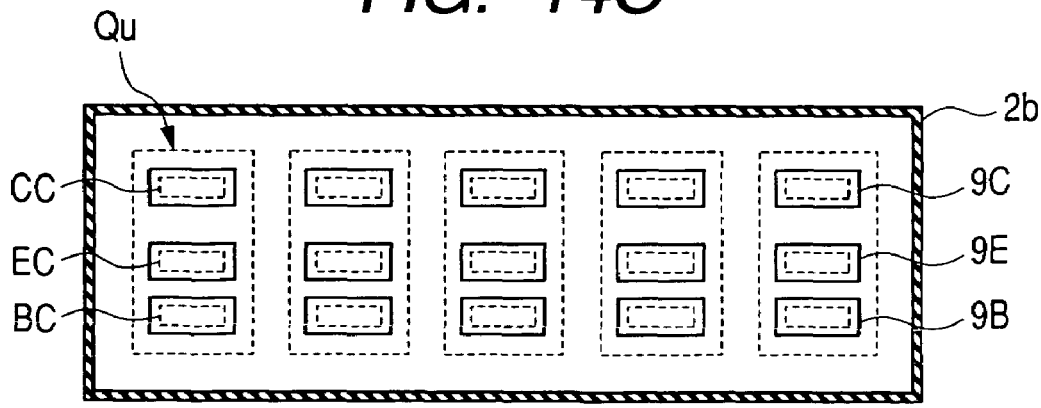

FIGS. 14A to 14C are plan views showing embodiments in a case of connecting a plurality of unit transistors Qu in parallel only in one direction. It is assumed here that each of the unit transistors Qu is connected in parallel by means of interconnections.

FIG. 14A is a plan view of an existent structure in which each of the unit transistors Qu has a device isolation trench 2b.

FIG. 14B and FIG. 14C show embodiments of removing the device isolation trench 2b for each of the unit transistors Qu and surrounding a plurality of unit transistors Qu connected in parallel entirely with one device isolation trench 2*b*.

Embodiment 5

Figure 15A:
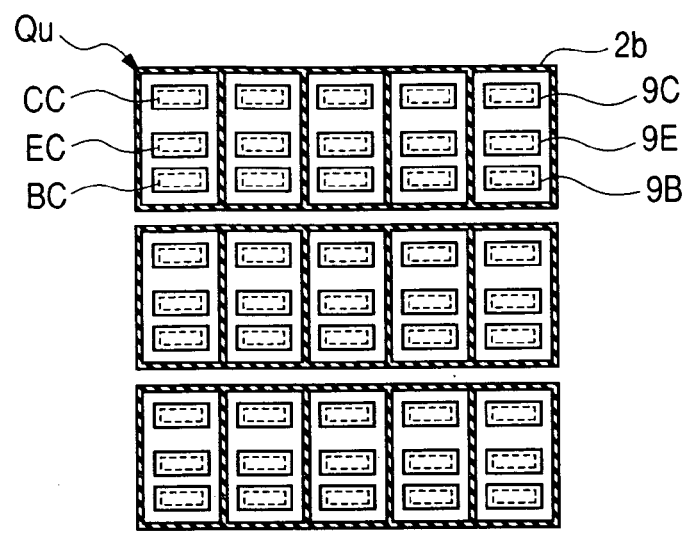
FIG. 15A is a plan view in a case of connecting in parallel a plurality of unit transistors shown in FIG. 1.
Figure 15B:
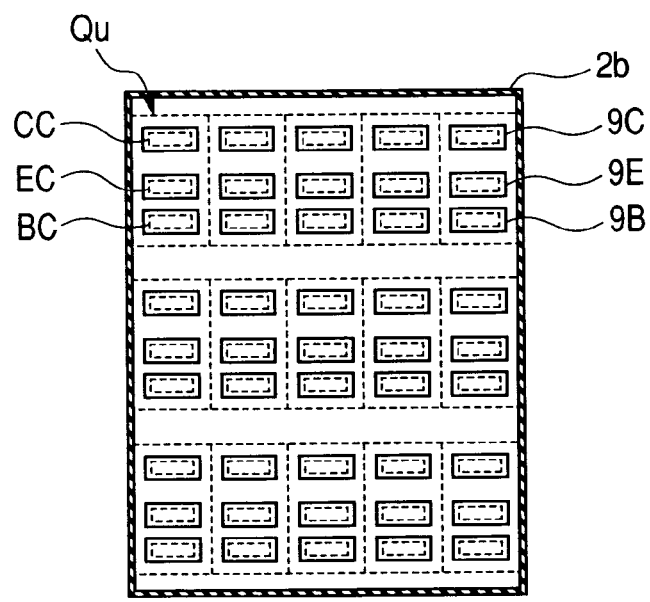
FIG. 15B and FIG. 15C are plan views in which a plurality of unit transistors as an embodiment of the invention are entirely surrounded with one device isolation trench.
Figure 15C:
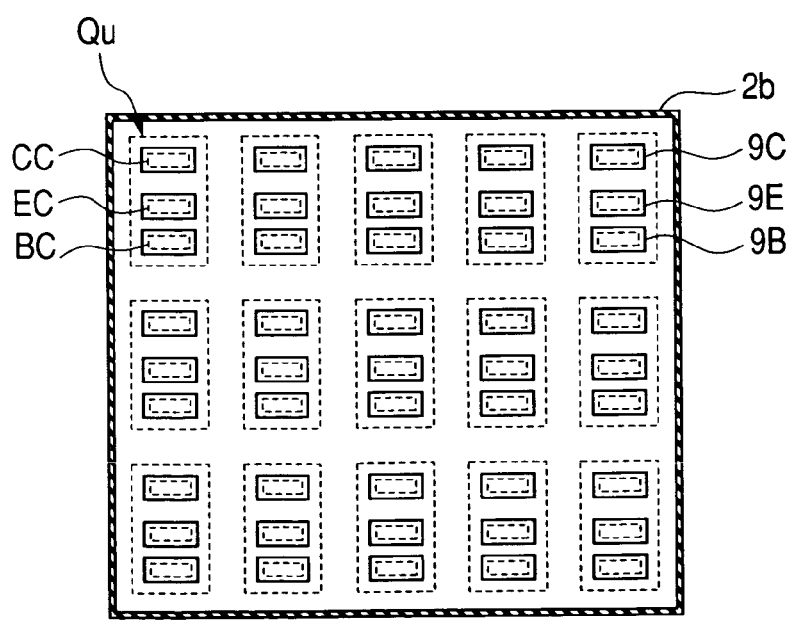

FIGS. 15A to 15C are plan views showing an embodiment in a case of connecting in parallel a plurality of unit transistors Qu in the direction of row and in the direction of column. Each of the unit transistors Qu is connected in parallel by interconnections.

FIG. 15A is a plan view of an existent structure in which each of the unit transistors Qu has a device isolation trench 2*b*.

FIG. 15B and FIG. 15C show embodiments in a case of removing the device isolation trench 2*b* for each of the unit transistors Qu and surrounding the plurality of unit transistors Qu connected in parallel entirely with one device isolation trench 2*b*.

Embodiment 6

Figure 16A:
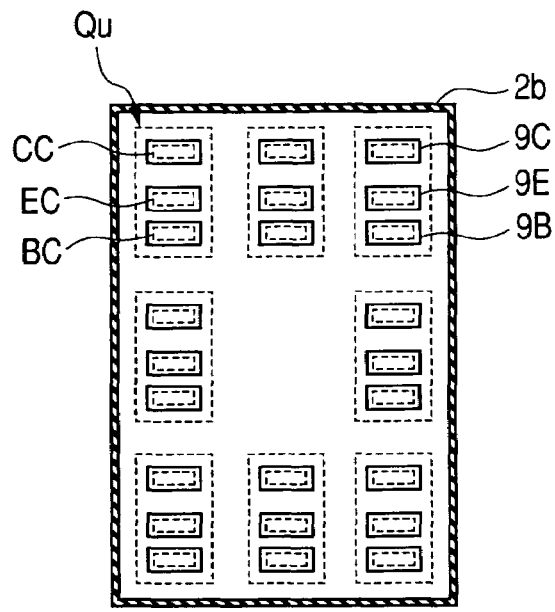
FIG. 16A and FIG. 16B are plan views in which a plurality of unit transistors connected in parallel as an embodiment according to the invention are entirely surrounded with one device isolation trench, and the unit transistors are arranged densely in the peripheral portion and thinly in the central portion.
Figure 16B:
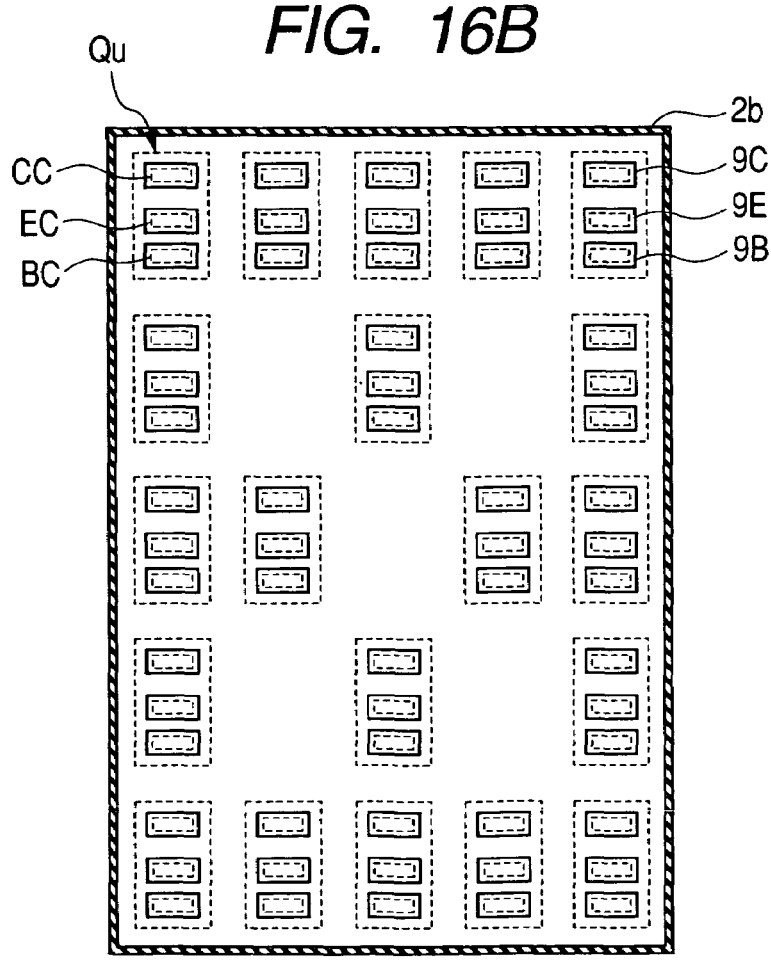

FIGS. 16A and 16B are plan views showing other embodiment in a case of connecting a plurality of unit transistors Qu in parallel in the direction of row and in the direction of column. It is assumed here that each of the unit transistors Qu is connected in parallel by interconnections.

As a result of thermal analysis, it has been found that the amount of heat generation of the unit transistors Qu situated in the central portion is higher compared with that in the peripheral portion.

FIG. 16A and FIG. 16B show embodiments of removing the device isolation trench 2*b* from each of the first unit transistors Qu and surrounding the plurality of unit transistors Qu connected in parallel entirely with one device isolation trench 2*b* and, further, arranging each of the unit transistors Qu densely in the peripheral portion and thinly in the central portion. With arrangement described above, the scattering of the thermal resistance between each of the unit transistors Qu can be decreased.

Embodiment 7

Figure 17A:
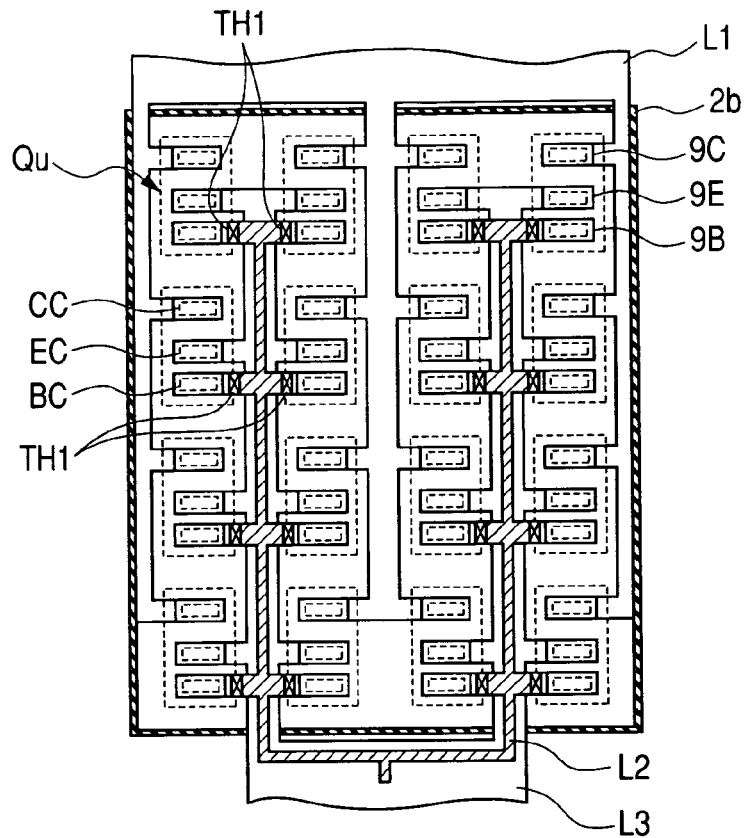
FIG. 17A is a plan view in which a plurality of unit transistors connected in parallel as an embodiment of the invention are entirely surrounded with one device isolation trench, emitter interconnection is extended in the direction of each of the columns, and the unit transistors in the direction of each column are disposed by the number more than that of the unit bipolar transistors in the direction of each row.
Figure 17B:
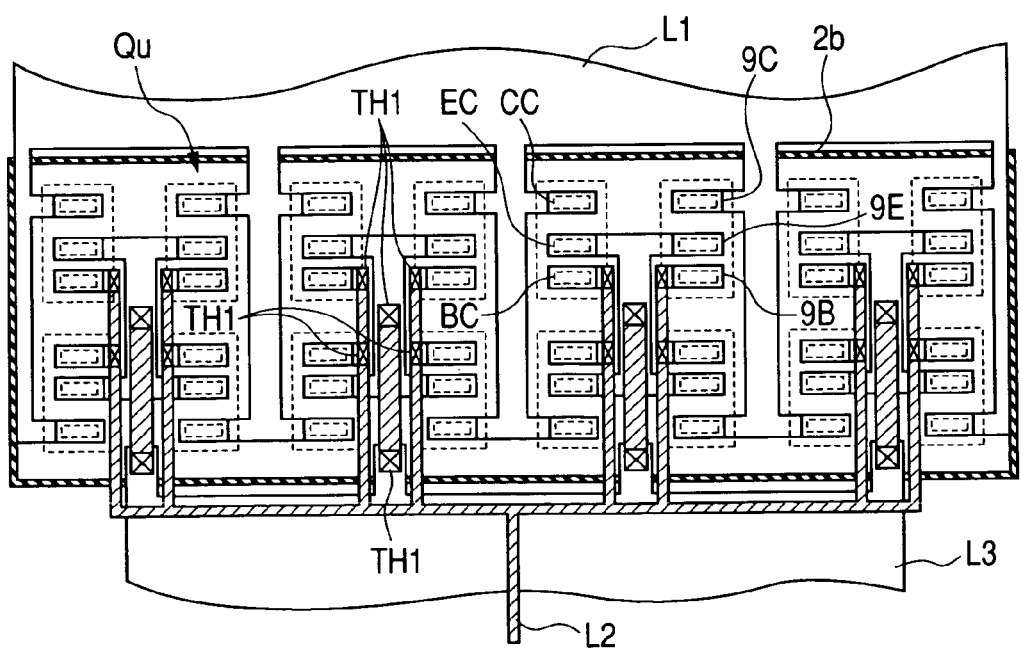
FIG. 17B is a plan view in which a plurality of unit transistors connected in parallel as an embodiment of the invention are entirely surrounded with one device isolation trench, emitter interconnection is extended in the direction of each of the columns, and the unit transistors in the direction of each column are disposed by the number less than that of the unit bipolar transistors in the direction of each row.

FIGS. 17A and 17B are plan views showing a further embodiment in a case of connecting a plurality of unit transistors Qu in parallel in the direction of row and in the direction of column. In this embodiment, emitter interconnections L3 are extended in the direction of each column. In a case of extending the emitter interconnection L3 in the direction of each column, as shown in FIG. 17B, it is preferred to adopt a structure in which the unit transistors in the direction of each column are disposed by the number less than the number of the unit transistors dispatch in the direction of each row. Further, the interconnection length from an emitter voltage supply portion to the emitter electrode for each of the unit transistors is formed as an equivalent length interconnection.

Due to the arrangement and interconnection structure of the unit transistors Qu as shown in FIG. 17B, the scattering for the emitter-base voltage VBE due to the parasitic resistance of the emitter interconnection can be decreased and this is a structure capable of preventing the device destruction due to the thermal runaway under the effect of the self heat generation effect of the unit transistors Qu disposed at a portion with low parasitic resistance of the emitter interconnection.

Embodiment 8

Figure 18A:
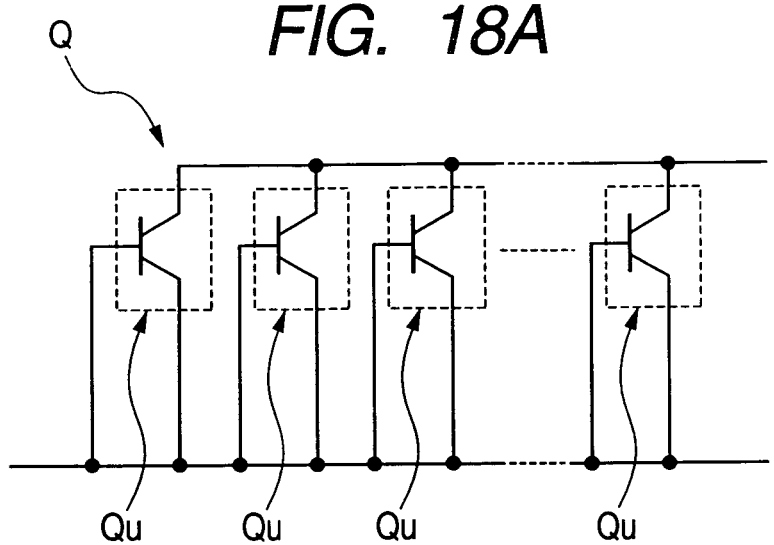
FIG. 18A is a circuit diagram in the case where a plurality of unit transistors whose emitter-base are connected by interconnections shown in FIG. 1A are connected in parallel with each other.
Figure 18B:
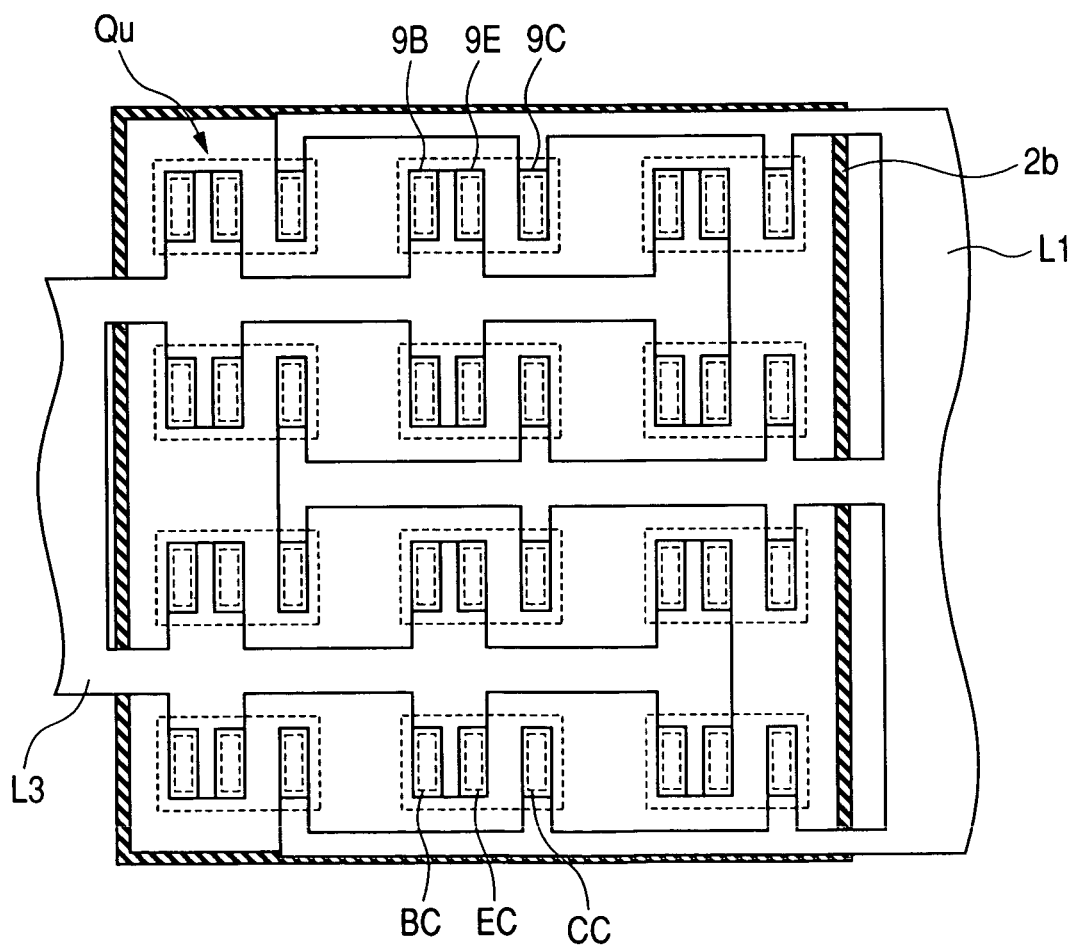
FIG. 18B is a plan view in a case of removing individual device isolation trenches for the unit transistors shown in the circuit diagram and the unit transistors connected in parallel entirely with one device isolation trench.

FIGS. 18A and 18B show a further embodiment in a case of connecting in parallel a plurality of unit transistors Qu shown in FIG. 9. This is an embodiment of connecting the emitters and the bases of the unit transistors shown in FIG. 9 by way of an interconnection L3, and using them as diodes. FIG. 18A is a circuit diagram for connecting a plurality of unit transistors Qu in parallel in which the emitters and the bases are connected by means of an interconnection and FIG. 18B is a plan view. The scattering of the thermal resistance between each of the unit transistors connected in parallel can be decreased in the same manner as in the embodiment of FIG. 9, and the capacitance relative to the substrate can also be decreased.

What is claimed is:

1. An integrated circuit device having a plurality of bipolar transistors connected in parallel, comprising:
    a substrate having an insulating layer at a major surface of the substrate;
    a semiconductor layer formed at the major surface of said substrate;
    an isolation trench traversing through the semiconductor layer to said insulating layer so that an area of the semiconductor layer is entirely surrounded by the isolation trench at said major surface and electrically isolated from the substrate and the remaining portions of the semiconductor layer;
    a plurality of device forming regions located in said semiconductor layer so as to be closely spaced from each other through portions of said semiconductor layer without forming device isolation trenches between the device forming regions;
    a buried collector region buried in each of said device forming regions between said insulating layer and said semiconductor layer, and
    a base region formed in said semiconductor layer over the corresponding buried collector region and an emitter region formed in said base region within each of said device forming regions, so as to configure the bipolar transistor in each of said device forming regions including the corresponding buried collector region.

2. An integrated circuit device having a plurality of bipolar transistors connected in parallel, comprising:
    a substrate having an insulating layer at a major surface of the substrate;
    a thin semiconductor layer formed at the major surface of said substrate;
    an isolation trench traversing through the semiconductor layer to said insulating layer so that an area of the semiconductor layer is entirely surrounded by the isolation trench at said major surface and electrically isolated from the substrate and the remaining portions of the semiconductor layer;
    a plurality of device forming regions located in said area of the semiconductor layer so as to be closely spaced from each other without forming device isolation trenches between the device forming regions;
    a buried collector region buried in each of said device forming regions between said insulating layer and said semiconductor layer, and
    a base region formed in said semiconductor layer over the corresponding buried collector region and an emitter region formed in said base region within each of said device forming regions, so as to configure the bipolar transistor in each of said device forming regions including the corresponding buried collector region,
    wherein the respective bipolar transistors formed in said area of the semiconductor layer are configured to perform electrically separate transistor functions but to cause heat generated by the respective bipolar transistors to dissipate laterally through said semiconductor layer thereby to decrease variations in thermal resistance among the bipolar transistors formed in said area of the semiconductor layer surrounded by said isolation trench.

3. An integrated circuit device having a plurality of bipolar transistors connected in parallel and integrated on a substrate, each of said bipolar transistors comprising:

an insulating layer formed on said substrate;

a thin semiconductor layer formed on said insulating layer;

an isolation trench traversing through the semiconductor layer to said insulating layer so that the semiconductor layer is entirely surrounded by the isolation trench at its lateral peripheries and electrically insulated by said insulating layer at its bottom from the substrate; and an area of said semiconductor layer provided with a base region, a base electrode electrically connected to the base region, an emitter region formed in said base region, an emitter electrode electrically connected to the emitter region, a collector region formed of the semiconductor layer, a buried collector region buried underneath said emitter region between said semiconductor layer and the insulating layer, and a collector electrode electrically connected to said buried collector region so as to configure a unit of the bipolar transistor within the area, wherein said isolation trench is arranged spaced apart by at least 8 μm from said area configured to perform as the unit of the bipolar transistor.

* * * * *